(12) United States Patent
Dasgupta et al.

(10) Patent No.: US 7,649,385 B2
(45) Date of Patent: Jan. 19, 2010

(54) LOGIC WITH STATE RETENTIVE SLEEP MODE

(75) Inventors: Aurobindo Dasgupta, Austin, TX (US); Mark Schuelein, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/500,820

(22) Filed: Aug. 7, 2006

(65) Prior Publication Data
US 2008/0030224 A1   Feb. 7, 2008

(51) Int. Cl.
*H03K 19/00*   (2006.01)
(52) U.S. Cl. .................. 326/93; 326/33; 326/95
(58) Field of Classification Search ........... 326/93–98; 327/201–203
See application file for complete search history.

(56) References Cited

U.S. PATENT DOCUMENTS

| | | | |
|---|---|---|---|
| 6,781,411 B2 * | 8/2004 | Steiss et al. | 326/46 |
| 6,956,421 B1 | 10/2005 | Schuelein | |
| 7,095,255 B2 | 8/2006 | Schuelein | |
| 7,170,327 B2 * | 1/2007 | Aksamit | 327/202 |
| 7,227,383 B2 * | 6/2007 | Hoberman et al. | 326/93 |
| 7,236,032 B2 | 6/2007 | Schuelein | |
| 2004/0075478 A1 * | 4/2004 | Correale et al. | 327/202 |
| 2006/0145724 A1 * | 7/2006 | McCarroll | 326/83 |

* cited by examiner

*Primary Examiner*—Anh Q Tran
(74) *Attorney, Agent, or Firm*—Erik R. Nordstrom

(57) ABSTRACT

Embodiments disclosed herein provide sleep mode solutions for retaining state information while reducing power in a logic block.

8 Claims, 3 Drawing Sheets

US 7,649,385 B2

LOGIC WITH STATE RETENTIVE SLEEP MODE

BACKGROUND

Many electronic devices such as portable devices including laptop computers, handheld devices and cellular phones have so-called sleep modes to save power when the device is on but not being used. Such devices typically have integrated circuit (IC) chips with logical blocks that have combinational logic and memory elements such as flip-flops, configured in varieties of ways, to perform various computing functions. When the sleep mode is entered, it is desirable to remove or reduce power from the logical blocks but at the same time, save the states (or values) in the memory elements so that operation can quickly be resumed when the device is re-activated.

Some solutions have involved powering down the memory elements to less than operational voltage levels but with sufficient power to retain the states in the memory elements during the sleep mode. However, for this approach to achieve meaningful power savings (leakage reduction), in many cases, special reduced-leakage transistors (e.g., with thick gates, long channels, etc.) have been required. Unfortunately, such transistors require special processes that can be costly and may not even result in desired leakage reduction.

Other schemes have employed the use of a separate, lower leakage memory element associated with each memory element for whose state is to be retained during a sleep mode. Data is transferred to the separate element just prior to entry of the sleep mode, where power to the rest of the logic and memory elements is substantially (if not completely) shut down. This provides for desired power reduction but requires additional circuit elements and sleep mode control signal routing, among other things.

Accordingly, a new state retentive, sleep mode solution is desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
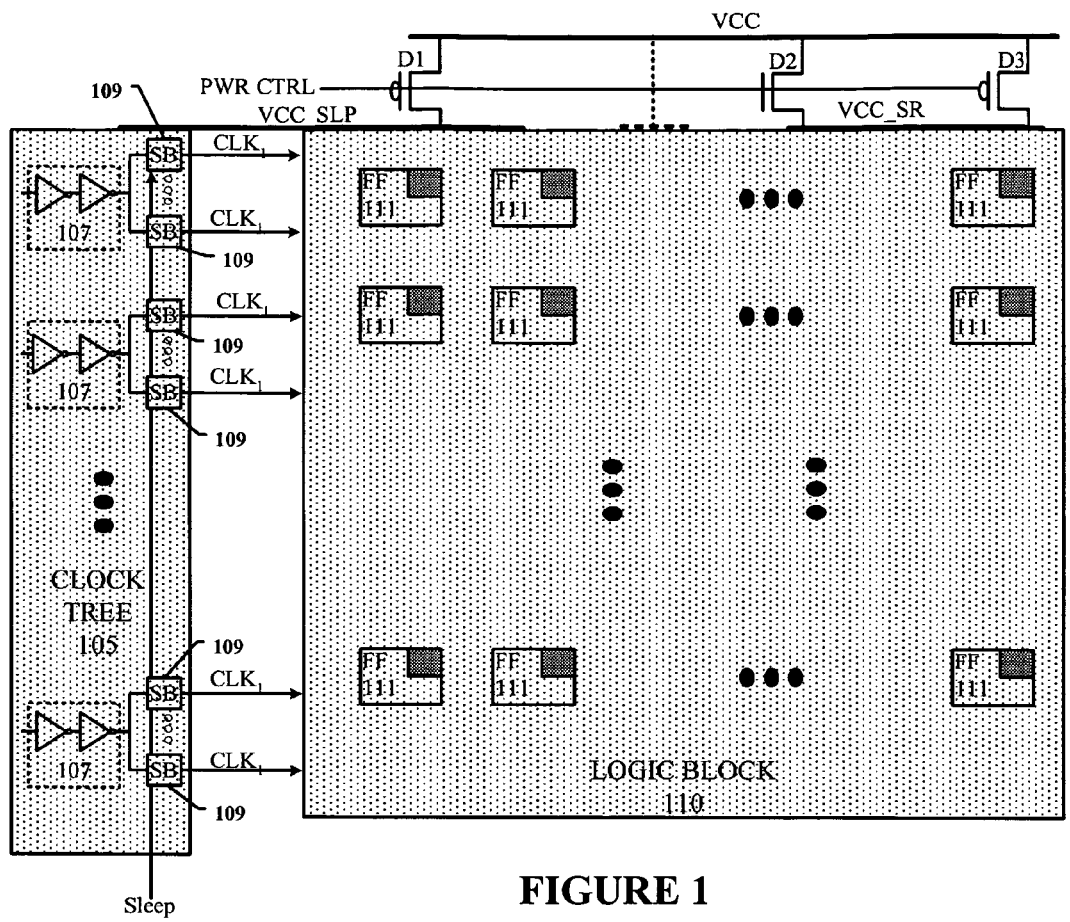
FIG. 1 is a general diagram of a logic block having a state retentive sleep mode in accordance with some embodiments.

FIG. 1 generally shows a logic block 110 coupled to clock tree 105 and voltage supplies: VCC, VCC_SLP, and VCC_SR through transistors D1, D2, and D3, which are commonly controlled by a power control signal (PWR CTL). The logic block comprises logic such as combinational logic (not specifically identified) incorporating a plurality of flip-flop memory elements 111. the flip-flops 111 and combinational logic, for example, may be coupled together to implement various different processing blocks such as arithmetic logic blocks, executable pipelines or pipeline portions, data and/or address transfer units, registers, and the like. Typically, they will be part of data (including process, address, and control data) pathways and will be used to clock data from one node to another node.

The clock tree 105 comprises several layers of buffers including a layer of conventional clock buffers 107, which fan-out to feed a layer (e.g., last layer of the tree) of sleep buffers (SB) 109. In turn, the sleep buffers 109 are each coupled to one or more flip-flop elements in the logic block 110 to provide them with a clock signal ($CLK_1$). When the sleep control signal (Sleep) is de-asserted, the sleep buffers 109 act like normal clock buffers, but when the Sleep signal is asserted (as discussed in more detail below), the sleep buffer outputs ($CLK_1$) are forced to go to a known, Low output state. As will later be appreciated, this may enhance the ability to shut power down from the clock tree 105, as well as from the logic block 110, during a sleep mode.

The VCC supply corresponds to an operational voltage supply (e.g., 1 V) for the logic block 110. The VCC_SLP supply is provided from the drain of PMOS transistor D1 and thus, it provides a supply approaching VCC when D1 is turned on but that collapses when D1 turns off. Finally, the VCC_SR supply is provided from the drains of transistors D2 and D3, which cannot be on at the same time since D2 is an NMOS transistor and D3 is a PMOS transistor. When D3 is on and D2 is off, the VCC_SR supply is essentially the same as VCC_SLP (which will also be on) approaching the level of VCC. On the other hand, when D2 is on (D1 and D3 off), the value of VCC_SR reduces approximately to VCC-$V_T$ (where $V_T$ is the threshold voltage of NMOS transistor D2), and VCC_SLP collapses.

(The term "PMOS transistor" refers to a P-type metal oxide semiconductor field effect transistor. Likewise, "NMOS transistor" refers to an N-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed. Along these lines, it should be appreciated that while D1, D2, and D3 are each represented, for simplicity, with a single transistor, they could actually be implemented with several transistors, e.g., coupled in parallel and strategically distributed. In addition, they could comprise transistors of different sizes, or coupled together in different ways to achieve desired supply characteristics.)

The darkly shaded portions of the flip-flops 111 identify a state retaining portion of a flip-flop to retain the state (or data) in the flip-flop when the sleep mode is entered and power to the rest of the block is removed. In some embodiments, a state retaining portion comprises a memory element (such as a memory cell in a slave latch) that is in the data path of the flip-flop. The state retaining areas are separately powered by the VCC_SR supply so that they can receive power (albeit lowered power in this embodiment) during a sleep mode to retain their states. (Note that in some embodiments, VCC_SR does not necessarily have to be reduced although it may be desired in order to reduce leakage in the state retaining portion during a sleep mode. Along these lines, in some embodiments, a supply higher than VCC_SR such as VCC may also be provided to the state retaining portions to provide for back body biasing resulting in further leakage reduction during the sleep mode.)

On the other hand, the lightly shaded areas in the flip-flops 111, as well as in the rest of the logic block and clock tree 105, are supplied by the VCC_SLP supply, which normally approaches VCC during active operation but collapses during a sleep mode. Accordingly, they powered down during the sleep mode. Thus, during a sleep mode, power supplied to most of the logic block 110, as well as to the clock tree 105, collapses resulting in meaningful leakage reduction, even for processes (e.g., 65 nm or smaller) with inherently "leaky" devices.

During normal operation, the PWR CTL signal is asserted (Low) thereby turning on transistors D1 and D3. This results in operational power being applied to both VCC_SLP and VCC_SR, which should be substantially equal to each other. At the same time, the Sleep signal is de-asserted, which causes the sleep buffers 109 to operate as normal clock buffers providing clock signals ($CLK_1$) to their destination logic block elements.

Upon entry of a sleep mode, the Sleep control signal is asserted, and the PWR CTL signal is de-asserted (High). This causes the sleep buffer 109 outputs ($CLK_1$) to go Low; it causes D1 and D3 to turn off thereby removing power from most of the logic block 110 and clock tree 105; and it causes the supplies to the state retaining portions of flip-flops 111 to be lowered to a level (VCC-$V_T$ in this embodiment) sufficient for retaining state data in the state retaining portions. When an active mode (e.g., normal operation) is to be resumed, the PWR CTL signal is again asserted, the sleep control signal is again de-asserted, and operation can seamlessly resume without the need to restore the flip-flops to their pre sleep mode states (i.e., transfer the pre-sleep mode data states into the flip-flops 111). That is, because, in some embodiments, the state retaining portions are in the flip-flop data paths, the retained state data will already be in the data path and ready to proceed.

(Note that while additional power is saved by lowering voltage to the state retaining portions, this is not necessary and may be omitted in some embodiments. Thus, D2 (or equivalent) could be omitted with VCC coupled to the state retaining portions.)

Figure 2:
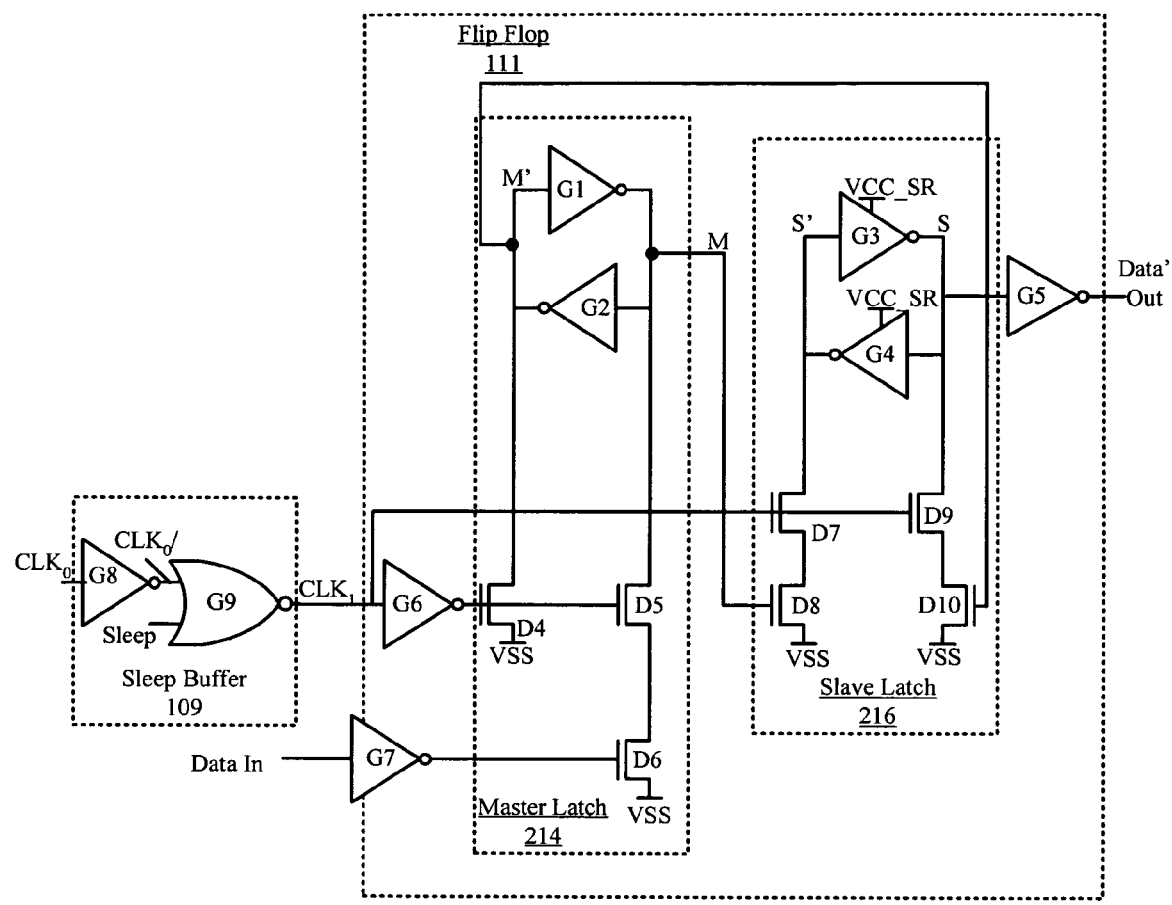
FIG. 2 is a schematic diagram of a state retentive flip flop circuit in accordance with some embodiments.

With reference to FIG. 2, a sleep buffer 109 coupled to a flip-flop 111, in accordance with some embodiments, is shown in greater detail. The sleep buffer 109 is coupled to the flip-flop 111 to provide it with a clock signal ($CLK_1$) in order to clock bit data into the flip-flop at its data input (Data In). The sleep buffer 105 comprises a NOR gate G9 and an inverter G8 coupled at its output to one of the NOR gate inputs. The other input receives the Sleep signal. The input to the inverter receives the Clock signal, e.g., from a lower level clock buffer 107 (FIG. 1). When the Sleep signal is de-asserted (Low in this embodiment), the sleep buffer 107 acts like a normal clock buffer, clocking the Clock signal through to the flip-flop at $CLK_1$. Conversely, when the sleep signal is asserted (High), the sleep buffer outputs a Low that should be sustained throughout the sleep mode. In some embodiments, this allows for power to be removed from the clock tree (and thus the sleep buffer 109) without adversely affecting state retention in the flip-flop 111.

In the depicted embodiment, flip-flop 111 is a rising edge, inverting D-type flip flop with a clock input ($CLK_1$), data input (Data In), and data output (Data' Out). It comprises inverters G5, G6, and G7; a master latch circuit 214; and a slave latch circuit 216, all coupled together as indicated.

The master latch 214 comprises cross-coupled inverters G1, G2, access transistors D4, D5 and a data input transistor D6. The cross-coupled inverters G1 and G2 form a memory cell with complementary bit storage nodes M and M'. Access transistors N4 and N5 are coupled, respectively, between VSS and data input transistor D6, which in turn, is also coupled to VSS. Inverter G6 is coupled between the $CLK_1$ signal and the gate inputs of access transistors D4, D5; while the Data In input is coupled to the gate input of data input transistor D6.

When $CLK_1$ is Low, the access transistors D4, D5 turn on, which causes the bit value at Data In to be provided to M, with its complement value provided to M'. During this time, the master latch 214 is said to be "transparent" whereby the bit value at Data In is projected to M/M'. Conversely, when $CLK_1$ is High, access transistors D4 and D5 turn off thereby preventing the bit value at M/M' from changing in response to any changes at Data In. During this time, the master latch is said to be "opaque" with a value held in its memory cell.

The slave latch 216 comprises cross-coupled inverters G3, G4, access transistors D7, D9, and data input transistors D8, D10. The cross-coupled inverters G3, G4 form a memory cell with complementary bit storage nodes at S and S'. Inverter G5 is coupled to the S node to provide an inverted, buffered bit output (Data" Out) of the bit data that entered the flip-flop at Data In. The bit storage nodes M, M' from master latch 214 are coupled to the gate inputs of data input transistors D8 and D10, respectively. The access transistors D7 and D9 are coupled between bit storage nodes S, S' and data input transistors D8, D10, respectively, and their gates are coupled to the $CLK_1$ signal. Thus, when $CLK_1$ is High, access transistors D7, D9 turn on thereby providing the bit values from M/M' to S/S'. During this clock phase, the slave latch is transparent. Conversely, when $CLK_1$ is Low, access transistors D7, D9 turn off and latch the bit value from M/M' (when CLK1 was High) into S/S' irrespective of whether M/M' changes. During this $CLK_1$ phase (Low), the slave latch is opaque.

As shown in FIG. 2, cross-coupled inverters G3, G4 from slave latch 216 are powered separately from the VCC_SR supply, while the rest of the circuit components are powered by the VCC_SLP supply. Accordingly, in this embodiment, the slave latch memory cell formed by G3 and G4 corresponds to the state retaining portion from FIG. 1. Under normal operation with the Sleep signal de-asserted (Low), and the PWR_CTL signal from FIG. 1 asserted (Low), data is clocked through the flip-flop, starting at Data In and proceeding to Data' Out one clock cycle later where its inverted form is provided.

Upon entry of a sleep mode, the Sleep signal asserts (High), and the PWR CTL signal de-asserts (High). This causes CLK1 to go Low, which causes the slave latch 216 to become opaque and hold the flip-flop's current state with memory cell G3/G4. At the same time, power in the flip-flop apart from memory cell G3/G4 is removed, while the VCC-SR supply to the memory cell G3/G4 is reduced but maintained sufficient to retain the latched data value in the G3/G4 memory cell. In this way, not only is the state data maintained in the G3/G4 memory cell, but also, it is isolated from the rest of the flip-flop, as well as from the rest of the logic block for that matter, which serves to stabilize it during the sleep mode. Upon re-entry into an active mode, the PWR CTL is asserted (Low), the Sleep signal is then de-asserted (Low), and operation in the flip-flop can resume from where it left off when entering the sleep mode. It should be appreciated that with this approach, the flip-flop doesn't have to be reset to its pre-sleep state because it is already there, which enhances the efficiency in switching in and out of sleep modes.

Figure 3:
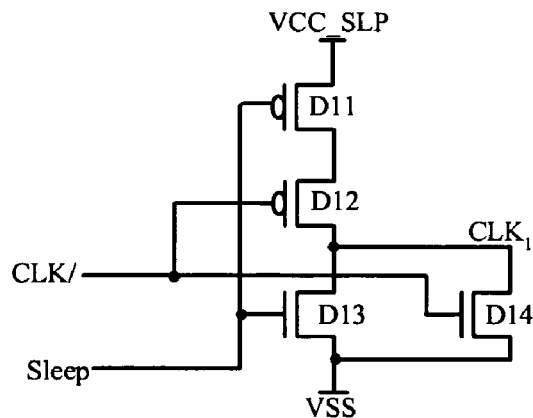
FIG. 3 is a schematic diagram of a NOR circuit suitable for use in a sleep mode clock buffer in accordance with some embodiments.

FIG. 3 shows a schematic diagram of a NOR gate circuit suitable for use as NOR gate G9. It's a conventional design with a pull-up PMOS stack formed from transistors D11 and D12 coupled between VCC_SLP and the drains of parallel-coupled NMOS transistors D13 and D14. Its output ($CLK_1$) is at the drains of D13, D14; its CLK/ input is coupled to the gates of D12 and D14, and its Sleep input is coupled to the gates of D11 and D13.

With this configuration, as long as the Sleep signal is asserted (High), the output will go Low, regardless of exactly when the VCC_SLP power is removed. Moreover, once the VCC_SLP is removed (and stays collapsed during a sleep mode), the output will remain Low, regardless of what happens to the Sleep signal. Thus, the Low at CLK1 will be stable and maintain the retained flip-flop state stable throughout the sleep mode. While this NOR gate embodiment functions well as NOR gate G9, it should be appreciated that other suitable configurations may be employed and are within the scope of the invention.

Figure 4:
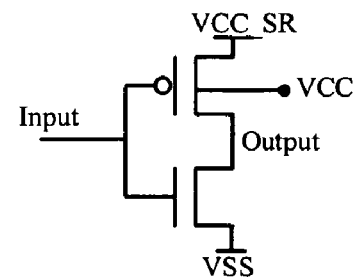
FIG. 4 shows an inverter circuit suitable for use in a state retentive cell in accordance with some embodiments.
Figure 5:
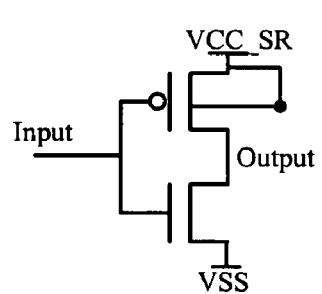
FIG. 5 shows another embodiment of an inverter circuit suitable for use in a state retentive cell in accordance with some embodiments.
Figure 6:
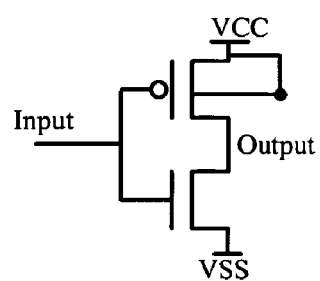
FIG. 6 shows yet another embodiment of an inverter circuit suitable for use in a state retentive cell in accordance with some embodiments.

FIGS. 4 through 6 show different schemes for supplying power to inverters G3 and/or G4 of from slave latch 216. They each constitute a conventional MOS inverter with the drain and gate from a PMOS and an NMOS transistor coupled together. In the embodiments of FIGS. 4 and 5, the source of the PMOS transistor is coupled to VCC_SR. However, with the inverter of FIG. 4, the base of the PMOS transistor is coupled to VCC, which causes it to be back-biased during a sleep mode thereby decreasing its leakage during the sleep mode. With the inverter of FIG. 5, on the other hand, the PMOS transistor's base is coupled instead to its source. This may result in less leakage reduction but may also be simpler to implement.

The inverter of FIG. 6 demonstrates that the state retaining inverters G3, G4 can be coupled to VCC, instead of to a separate VCC_SR and still result in considerable power savings outside of the state retaining portions. Along these lines, it should be appreciated that numerous different suitable ways to supply power to the state retaining portions and to the rest of the logic block and clock tree 105 exist and are within the scope of the invention.

Figure 7:
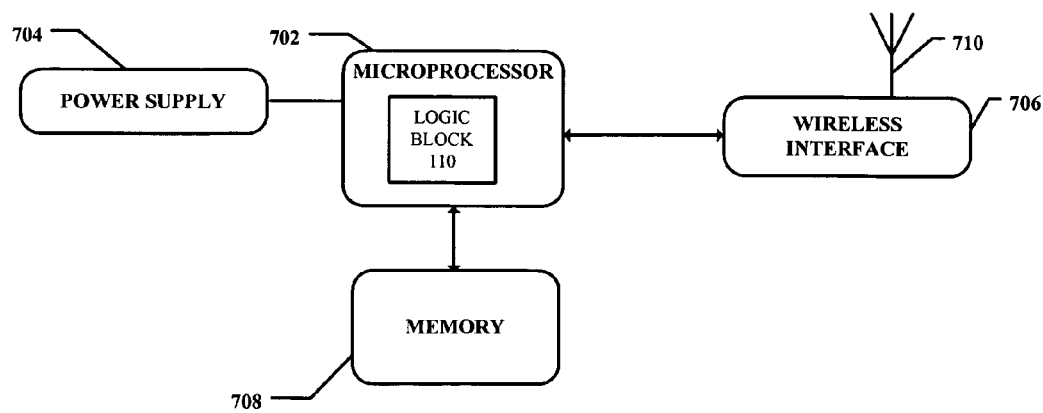
FIG. 7 shows a computer system having combinational logic with a state retentive sleep mode in accordance with some embodiments.

With reference to FIG. 7, one example of a computer system is shown. The depicted system generally comprises a processor 702 that is coupled to a power supply 704, a wireless interface 706, and memory 708. It is coupled to the power supply 704 to receive from it power when in operation. The wireless interface 706 is coupled to an antenna 710 to communicatively link the processor through the wireless interface chip 706 to a wireless network (not shown). Microprocessor 702 comprises one or more logic blocks 110 with state retaining portions such as are disclosed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A circuit apparatus, comprising:
    a logic block having data paths comprising clocked memory devices each having a state retaining portion; and
    a clock tree coupled to the logic block to provide clock signals to the clocked memory devices, the state retaining portions being supplied with a state retaining supply, and at least a portion of the remainder of the logic block and clock tree to be supplied by at least one collapsible supply that is to collapse during a sleep mode, while the state retaining supply is to be at a sufficient level to maintain the states in the state retaining portions during the sleep mode, wherein the state retaining portions are controlled to retain their states in the sleep mode in response to the clock signals without the need for an additional signal.

2. The circuit apparatus of claim 1, in which the clocked memory devices comprise flip-flops.

3. The circuit apparatus of claim 2, in which the state retaining portion comprises a memory cell in a latch of a flip-flop.

4. The circuit apparatus of claim 3, in which the latch comprises a slave latch.

5. The circuit apparatus of claim 3, in which the clock tree comprises sleep buffers to provide the clock signals, said sleep buffers to provide a Low output in response to an asserted sleep control signal.

6. The circuit apparatus of claim 5, in which the memory cell holds its state and is isolated from the rest of the logic block when the sleep control signal is asserted and the at least one collapsible supplies are collapsed.

7. A system, comprising:
    (a) a microprocessor comprising a logic block having data paths comprising clocked memory devices each having a state retaining portion, and
        a clock tree coupled to the logic block to provide clock signals to the clocked memory devices, the state retaining portions being supplied with a state retaining supply, and the remainder of the logic block and clock tree to be supplied by at least one collapsible supply that is to collapse during a sleep mode, while the state retaining supply is to be at a sufficient level to maintain the states in the state retaining portions during the sleep mode, wherein the state retaining portions are controlled to retain their states in the sleep mode in response to the clock signals without the need for an additional signal;
    (b) an antenna; and
    (c) a wireless interface coupled to the microprocessor and to the antenna to communicatively link the microprocessor to a wireless network.

8. The system of claim 7, further comprising a battery to supply power to the microprocessor.

* * * * *